United States Patent
Lee et al.

[19]

[11] Patent Number: 6,130,468
[45] Date of Patent: Oct. 10, 2000

[54] FUSE, MEMORY INCORPORATING SAME AND METHOD

[75] Inventors: Roger Lee; Dennis Keller; Ralph Kauffman, all of Boise, Id.

[73] Assignee: Micron Technology, Inc., Boise, Id.

[21] Appl. No.: 09/021,968

[22] Filed: Feb. 11, 1998

[51] Int. Cl.[7] .............................. H01L 29/00; H01L 21/44
[52] U.S. Cl. .......................... 257/529; 438/601; 438/706
[58] Field of Search .................................. 257/528, 529, 257/530; 438/601, 602, 539, 540, 706, 723, 724

[56] References Cited

U.S. PATENT DOCUMENTS

| | | | |
|---|---|---|---|
| 5,578,517 | 11/1996 | Yoo et al. | 437/60 |
| 5,583,463 | 12/1996 | Merritt | 327/526 |
| 5,602,783 | 2/1997 | Ong | 365/189.05 |
| 5,602,785 | 2/1997 | Casper | 365/189.11 |
| 5,729,041 | 3/1998 | Yoo et al. | 257/529 |
| 5,754,089 | 5/1998 | Chen et al. | 257/529 |
| 5,760,453 | 6/1998 | Chen | 438/540 |
| 5,773,869 | 6/1998 | Froehner | 257/530 |
| 5,848,007 | 12/1998 | Takahashi | 365/200 |
| 5,879,966 | 3/1999 | Lee et al. | 438/132 |
| 5,895,962 | 4/1999 | Zheng et al. | 257/529 |

*Primary Examiner*—Benjamin L. Utech
*Assistant Examiner*—Duy-Vu Deo
*Attorney, Agent, or Firm*—Dorsey & Whitney LLP

[57] ABSTRACT

A method of making a fuse and a fuse, together with systems and integrated circuits where the fuse provides benefits, are described. A fuse comprising a conductive material is formed on a substrate. A series of dielectric layers having a composite thickness is formed on the substrate and the fuse. The series of dielectric layers serves to insulate a series of conductive layers from each other. The conductive layers are disposed above portions of the substrate. An opening is formed extending through a passivation layer and the series of dielectric layers. The opening exposes a portion of the fuse. Another dielectric layer is formed on the fuse and the fuse may thereafter be programmed by directing a laser beam onto the fuse through the opening.

22 Claims, 5 Drawing Sheets

FUSE, MEMORY INCORPORATING SAME AND METHOD

TECHNICAL FIELD

This invention relates in general to fuses having application to programming of integrated circuitry, and more particularly to fuses useful for replacement of defective memory cells.

BACKGROUND OF THE INVENTION

FIG. 1 is a simplified cross-sectional view of a portion of an integrated circuit 10. The integrated circuit 10 includes a semiconductor substrate 18 in which active circuitry, designated generally by reference numeral 20, is fabricated. The active circuitry 20 may implement a variety of devices, including a conventional memory device, such as a dynamic random access memory ("DRAM") or a static random access memory ("SRAM").

Integrated circuits 10 incorporating active circuitry 20 that form a memory device include large numbers of memory cells. In fact, because of the large number of memory cells, there is a significant probability that at least some of the memory cells will be defective. Defective memory cells are typically discovered during testing and before packaging the integrated circuit 10. To avoid the need to discard memory devices having a relatively small number of defective memory cells, techniques have been developed for the post-manufacture replacement of defective memory cells with redundant memory cells specifically provided for that purpose. Typically, memory cells are replaced in one or more groups of memory cells (i.e., rows or columns).

With further reference to FIG. 1, one technique for selecting defective rows or columns of memory cells for replacement is to blow a pattern of fuses to correspond to a defective row or column of memory cells. A typical fuse 25 is shown in FIG. 1. Blowing a combination of the fuses 25 causes data to be written to or read from redundant memory cells rather than the defective memory cells corresponding to the pattern of blown fuses.

The fuses 25 are typically formed as a layer of polysilicon 24 on a dielectric layer 21, which insulates the polysilicon layer 24 from the substrate 28 comprising the integrated circuit 10. One or more layers of conductive material 22, such as a layer of tungsten silicide, is then formed on the polysilicon layer 24. For example, the conductive layer 22 may have a thickness of 1,200+/−200 angstroms and the polysilicon layer 24 may have a thickness of 1,000+/−200 angstroms. Other types of conductive material, such as metals, may be used for the conductive layer 22 or the polysilicon layer 24. The conductive layer 22 is covered by a thin layer of dielectric material 27 that is integrally formed with a relatively thick layer dielectric layer 30 having a thickness $T_1$. A first conductive layer 32 may then be fabricated on the surface of the dielectric layer 30. The conductive layer 32 and the dielectric layer 30 may then be coated with another dielectric layer 34 having a thickness of $T_2$ on which a second conductive layer 36 may be fabricated. If so, the conductive layer 36 and the dielectric layer 34 may then be coated with another dielectric layer 38 having a thickness $T_3$. The conductive layers 32 and 36 typically comprise polysilicon, but may be realized as metal layers.

In some applications, the fuses 25 are blown by focusing a laser beam to vaporize the layer of conductive material 22. In these cases, the dielectric layer 27 is chosen to be transparent to the laser light, and the conductive material 22 is chosen to strongly absorb the laser light. When the laser light is incident on the conductive material 22, the fuse 25 is blown by vaporizing the conductive material 22. Additionally, a series of other fuses 25 may be optionally blown at this time to encode various data regarding the part being manufactured.

In other applications, the fuses 25 are blown by directing a current through selected fuses 25 that is sufficient to vaporize the layer of conductive material 22. In either case, precise control of the thickness of the dielectric layer 27 overlying the fuse 25 is critical to successfully blowing the fuse 25. When the dielectric layer 27 is too thick, the fuse 25 may not blow or may blow but also create a crater beneath the fuse 25 because the vaporized fusible material is confined. When the dielectric layer 27 is too thin, the fuse 25 may merely melt and then re-solidify to form a conductive stringer. Alternatively, the fuse 25 may be partially melted and partially vaporized, causing conductive, molten material to be deposited in undesirable locations. This can result in circuit malfunction.

The fuse 25 is typically exposed so that it can be blown with a laser by etching the dielectric layers 30, 34, 38 as shown in FIG. 1. The etching of the dielectric layer 30 is stopped just above the fuse 25, thereby forming the dielectric layer 27. The etching process typically is stopped when the layer of dielectric material 27 on the fuse 25 is about 2,000 to 3,000 angstroms. When the composite thickness of the dielectric layers 30, 34, 38 is, for example, four microns, a 2,500 angstrom thick dielectric layer 27 is about 6.25% of the composite thickness. Thus, etching the dielectric layers 30, 34, 38 so that the dielectric layer 27 has a thickness in the acceptable range of 2,000–3,000 angstroms requires control of the etching process within 1.25%, i.e., 6.25%+/−1.25%. Currently used etching processes are capable of etching to 2,500+/−500 angstroms as long as the composite thickness of the dielectric layers 30, 34, 38 is not significantly greater than four microns. However, increasing circuit complexity requires additional conductive layers for forming interconnections and therefore additional dielectric layers formed between the conductive layers. As the composite thickness increases, it is increasingly difficult to stop the etching of the dielectric layers when the dielectric layer 27 remaining on the fuse 25 has the correct thickness. Variations in the composite thickness across the substrate 28 also increase with increases in the composite thickness of the dielectric layers, as do wafer-to-wafer variations and variations in etch rates, both across a wafer and from wafer to wafer.

There is therefore a need for a technique to provide fuses on complex integrated circuits having the correct thickness of dielectric material on the fusible material.

SUMMARY OF THE INVENTION

Briefly stated, embodiments of the present invention encompass fuses and methods of making fuses, together with systems and integrated circuits where the fuses provide benefits. The fuses are made by a method that provides control over the thickness of a dielectric layer formed on the fuse material, irrespective of the thickness of dielectric layers previously formed on the fuse. The resulting fuses maintain the electrical and mechanical characteristics needed in order to be able to blow the fuses reliably and with good fuse-to-fuse repeatability.

A fuse comprising a conductive material is formed on a substrate and a series of dielectric layers having a composite thickness are formed on the substrate and the fuse. The series of dielectric layers serves to insulate a series of conductive layers from each other. The conductive layers are formed above portions of the substrate. An opening is formed that extends through the series of dielectric layers. The opening exposes a portion of the fuse. A dielectric layer having a controlled thickness is formed on the series of dielectric layers and the fuse.

DETAILED DESCRIPTION OF THE INVENTION

As the complexity of integrated circuits increase, for example, for memory arrays having 16 megabytes or more of storage capacity, the need also increases for progressively more complex interconnections. To meet these needs, a series of interconnections comprising conductive layers separated by dielectric layers is required.

Figure 1:
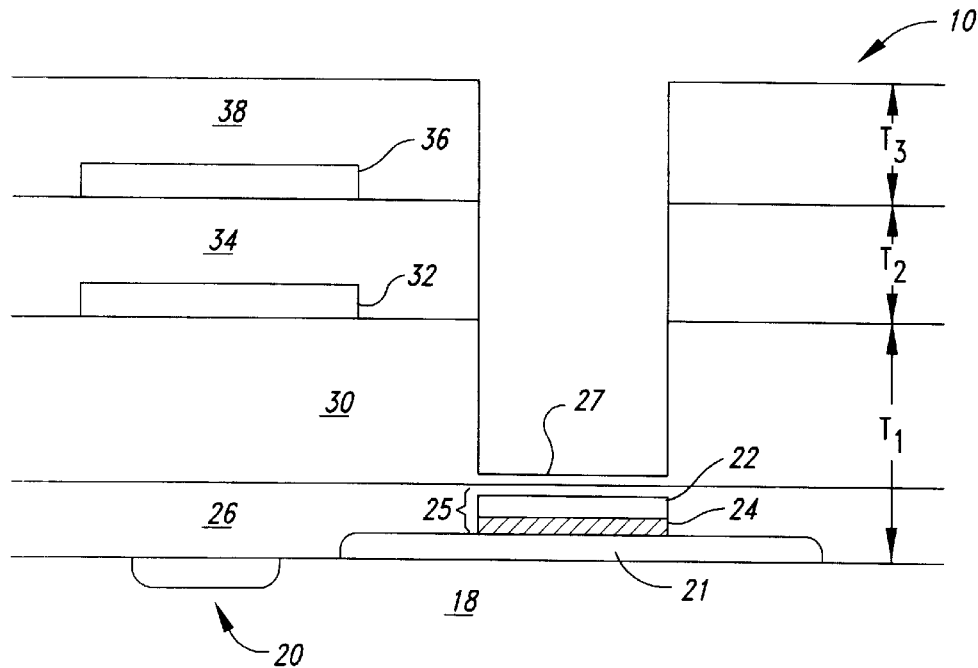
FIG. 1 is a simplified side cross-sectional view of a portion of an integrated circuit according to the prior art.
Figure 2:
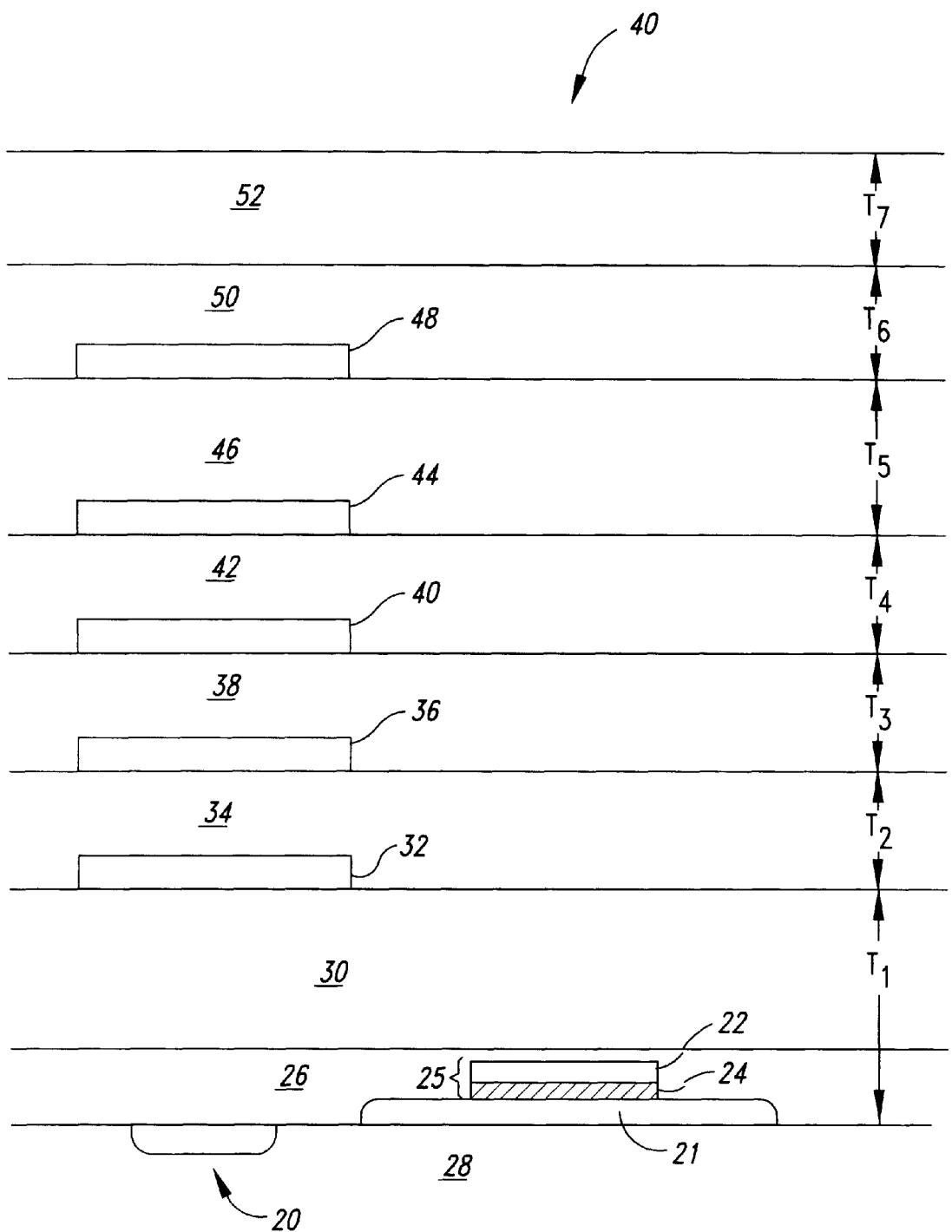
FIG. 2 is a simplified side cross-sectional view of a portion of an integrated circuit at one stage in processing according to an embodiment of the present invention.

FIG. 2 illustrates an example of an integrated circuit 40 that is identical to the integrated circuit 10 of FIG. 1 except that it includes additional conductive and dielectric layers. More specifically, the integrated circuit 40 includes additional conductive layers 40, 44 and 48 separated from each other and insulated by a series of additional dielectric layers 42, 46, 50 and 52, however, more or fewer conductive and intervening dielectric layers may be used. The conductive layers 32, 36, 40, 44 and 48 typically are displaced laterally from the fuses 25 by twenty five microns or more.

The conductive layers 32, 36, 40, 44 and 48 are conventional thin film, patterned conductive layers and may be formed by conventional evaporation, sputtering or other deposition techniques. The dielectric layers 34, 38, 42, 46 and 50 may be silicon dioxide deposited by conventional TEOS processes and may be conventionally densified, or may have other compositions or be formed by other processes including atmospheric pressure chemical vapor deposition, low pressure chemical vapor deposition, plasma-enhanced chemical vapor deposition and the like. The dielectric layer 52 may be silicon nitride deposited by plasma-enhanced chemical vapor deposition. A composite thickness $T_C = T_1 + T_2 + T_3 + T_4 + T_5 + T_6 + T_7$ of the dielectric layers 26, 30 34, 38, 42, 46, 50 and 52, in this example, could well be seven microns or as much as eight microns, or a subset of these dielectric layers may provide four microns or more or less of composite thickness $T_C$. A composite dielectric thickness $T_C$ this large is too thick to form a thin dielectric layer over the fuse 25 using the technique shown in FIG. 1. For a composite thickness of eight microns, for example, it would be possible to control the thickness of the dielectric layer only to within about ±1,000 angstroms using current techniques. As a result, it would not be possible to ensure that the dielectric layer had a thickness in the range of 2,000–3,000 angstroms.

Figure 3:
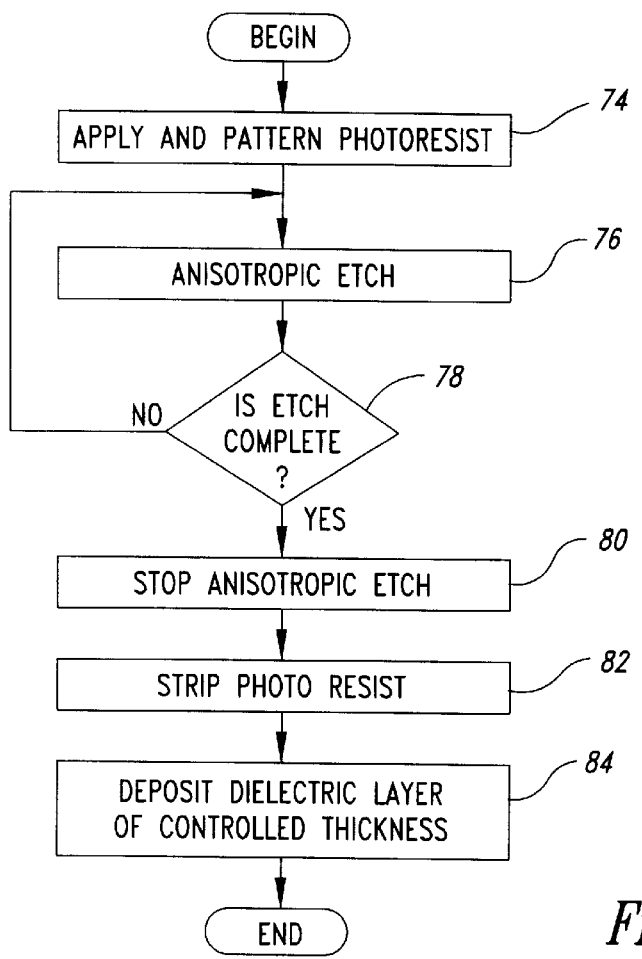
FIG. 3 is a flow chart of a process for manufacturing an integrated circuit according to an embodiment of the present invention.
Figure 4:
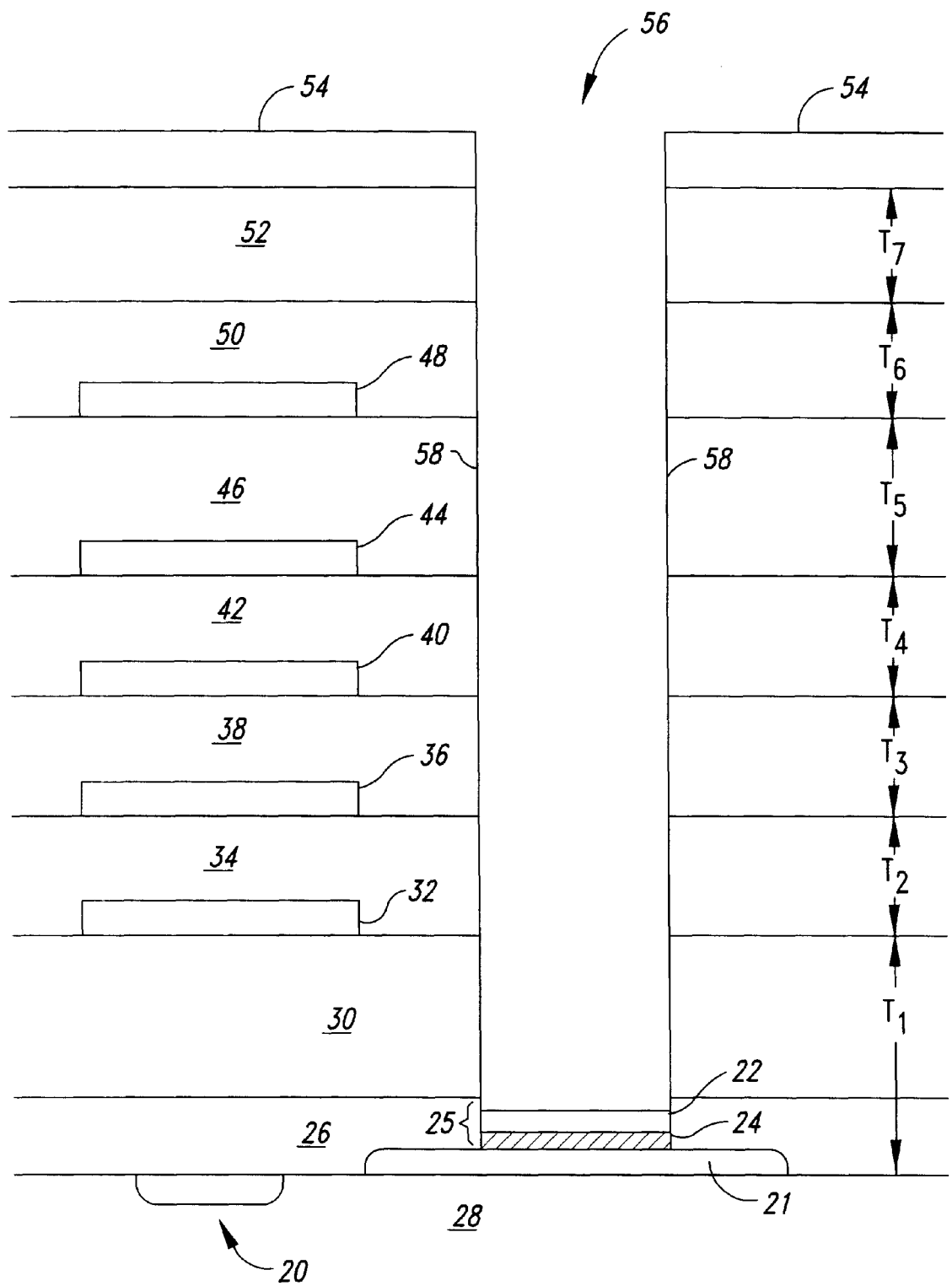
FIG. 4 is a simplified side cross-sectional view of a portion of an integrated circuit at a later stage in processing according to an embodiment of the present invention.

FIG. 3 is a flow chart of a process for manufacturing an integrated circuit according to an embodiment of the present invention. FIG. 4 shows the structure being formed by steps 74 through 80 of the process. With reference to FIGS. 3 and 4, the process begins in step 74 by applying and patterning a layer of photoresist 54 via conventional processes. The patterned photoresist layer 54 covers the entire upper surface of the top dielectric layer 52 except for an area overlying the fuse 25. In step 76, an anisotropic plasma etch is performed through the exposed area of the photoresist to form openings 56 extending through the dielectric layers 26, 30, 34, 38, 42, 46, 50 and 52. In other words, the plasma etching process etches much more rapidly through the thickness of the dielectric layers 26, 30, 34, 38, 42, 46, 50 and 52 than it does laterally. The highly directional nature of the anisotropic etch allows the opening 56 to be formed with vertical sidewalls 58 as shown in FIG. 3. This results in a compact structure because the size of the opening 56 is maintained constant through the depth of the dielectric layers 26, 30, 34, 38, 42, 46, 50 and 52, rather than being much broader in the layer 52 than in the dielectric layers 26 and 30 that are closer to the substrate 28.

In one embodiment, the width (i.e., the distance into and out of the plane of FIG. 4) of the opening 56 is about ten microns. The length (i.e., the lateral extent left and right in the plane of FIG. 4) of the opening 56 depends on the number of fuses that are being contained within the opening 56. It has been discovered that the need to precisely control the depth of etching through the series of dielectric layers 26, 30, 34, 38, 42, 46, 50 and 52 is relaxed when the materials chosen for the fuse 25 and the substrate 28 are not readily etched by the plasma etching process used to etch the opening 56. The need to precisely control the etching process is further reduced when an anisotropic etch process is used to completely remove the dielectric layers including the dielectric layer 26 on the fuse 25. While FIG. 1 shows the opening 56 as having edges that coincide with the edges of the fuse 25, several fuses 25 may be formed in one opening 56, and the edges of the fuses 25 or portions of the substrate 28 between fuses 25 in a common opening 56 may be exposed to the etching process. Use of an anisotropic etch that also does not etch the substrate 28 or the conductive layer 22 allows deliberate overetching of the opening 56 without undercutting the fuse structure 25, even when the edges of the fuse 25 and portions of the dielectric layer 21 are exposed to the etch. The fuse 25 and the substrate 28 can then act as etch stops.

Referring now to FIG. 3, when a query task 78 determines that the etching process of step 76 is complete, the anisotropic plasma etch process is stopped in step 80. Otherwise, the etching process is continued as in step 76. In one embodiment, the query task 78 may be based on an endpoint detection that determines that the etching process has reached the conductive layer 22, or, alternatively, the substrate 28. In another embodiment, the query task 78 may allow passage of enough time to ensure that the anisotropic etching process of step 76 has extended all of the openings 56 to all of the fuses 25.

Figure 5:
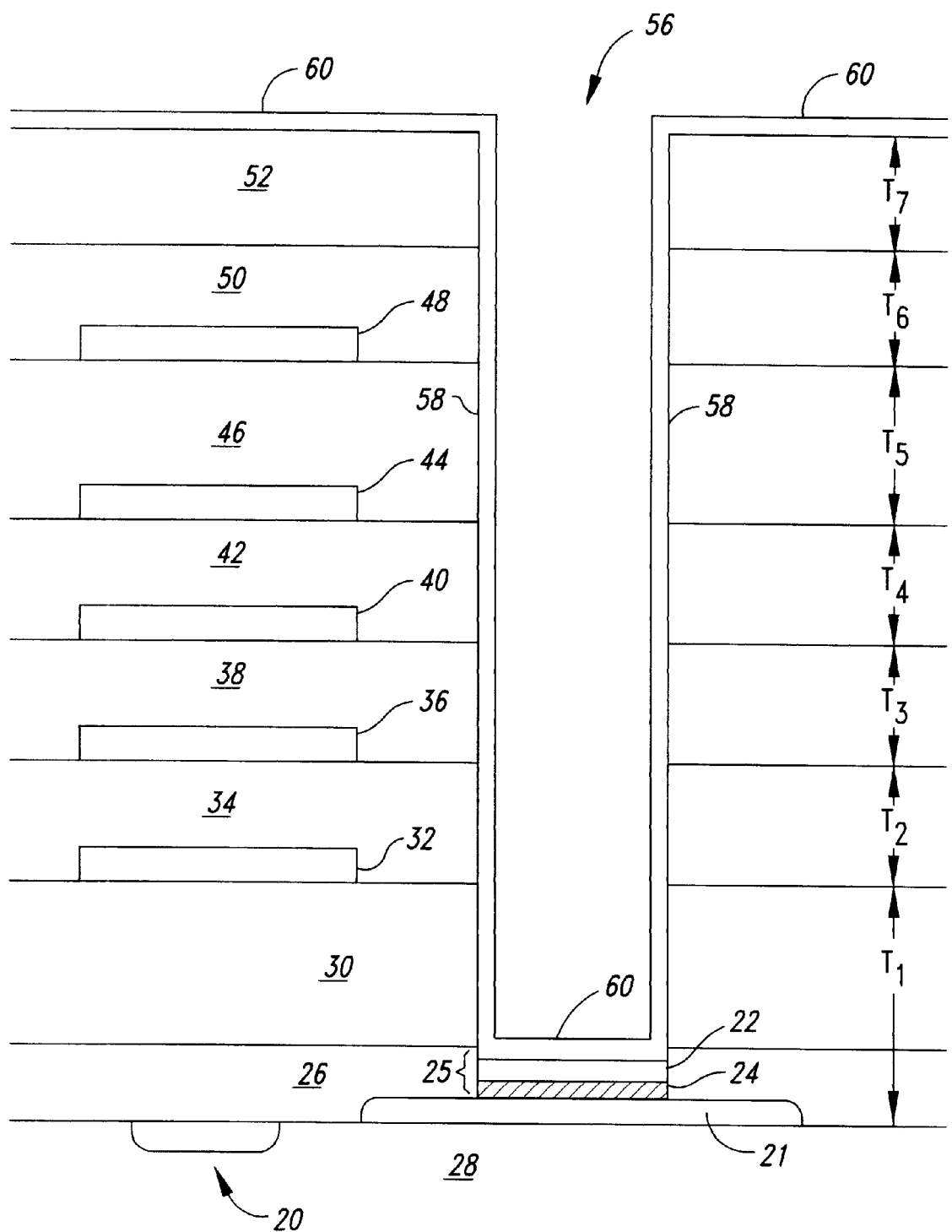
FIG. 5 is a simplified side cross-sectional view of a portion of an integrated circuit at a still later stage in processing according to an embodiment of the present invention.

FIG. 5 is a simplified side cross-sectional view of a portion of an integrated circuit at a still later stage in processing according to an embodiment of the present invention. With reference now to FIGS. 3 and 5, the opening 56 has been etched to completely remove the dielectric layer 26 from the fuse 25. In step 82, the photoresist layer 54 of FIG. 4 is stripped. In step 84, a dielectric layer 60 is formed on all exposed surfaces, including the fuses 25. In one embodiment of the present invention, the dielectric layer 60 is a layer of silicon dioxide formed via a conventional TEOS process and having a thickness of 2,000 to 3,000+/−300 angstroms, however, other dielectric materials and/or thicknesses may be employed. The process then ends and other processing, testing and packaging steps may be carried out.

By etching all of the openings 56 to expose all of the fuses 25 and then depositing the dielectric layer 60, a uniformly thick dielectric layer 60 is provided on all of the fuses 25. This is true regardless of variations in the composite dielectric layer thickness $T_C$ or etch rates across the wafer. This also does not result in significant etching of the materials comprising the fuse 25 or the substrate 28. The characteristics of the fuses 25 and the parameters for blowing the fuses 25 are then uniform across the die or wafer. The thickness of the dielectric layer 60 on the fuse 25 is independent of variations in the composite thickness $T_C$ of the series of dielectric layers 26, 30, 34, 38, 42, 46, 50 and 52 and is also independent of variations in etch rate in etching of the openings 56, either across an individual device or wafer or from one wafer to another wafer.

Although the dielectric layer 60 is shown in FIG. 5 as lining the sides of the opening 56 and covering the exposed surface of the dielectric layer 52, it will be understood that it s only necessary for the dielectric layer 60 to overlie the fuse 25.

Following completion of the structure shown in FIG. 5 according to the process of FIG. 2, wafer-level testing is carried out. In one embodiment, defective rows and columns of memory cells are detected and then fuses 25 are blown in a pattern corresponding to the defective rows or columns by focusing 1047 nanometer laser light of appropriate intensity and duration to a spot size of about five microns on the fuse 25 to vaporize the conductive materials 22 and 24. This allows devices that were manufactured with some defective memory cells to be useful as memory devices.

Figure 6:
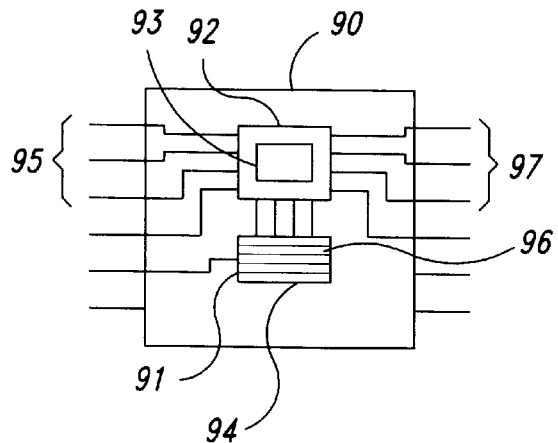
FIG. 6 is a simplified block diagram of a memory employing fuses in accordance with an embodiment of the invention.

FIG. 6 is a simplified block diagram of a memory device 90 employing fuses 96, such as fuse the 25 of FIG. 5, in accordance with an embodiment of the invention. As shown in FIG. 6, the memory device 90 includes a primary circuit 92 and an auxiliary circuit 94. The primary circuit 92 includes a conventional memory array 93 having memory cells arranged in rows and columns where individual cells in the memory array 93 are accessed by addresses provided at address terminals 95. Data are transferred to and from the memory array 93 via data terminals 97.

The auxiliary circuit 94 includes several fuse circuits 96 that perform auxiliary functions, such as substituting redundant rows or columns 91 for defective rows or columns. While the primary circuit 92 and the auxiliary circuit 94 are shown separately for clarity of presentation, one skilled in the art will recognize that the primary circuit 92 and the auxiliary circuit 94 are typically integrated into a common substrate.

In many such memory arrays 93, several redundant rows and columns of memory cells 91 are provided to be used as substitutes for defective rows and columns of memory cells in the memory array 93. When a defective bit location is identified, rather than treating the entire memory device 90 as defective, a redundant row or column 91 is substituted for the row or column containing the defective memory cell or cells. This substitution is performed by assigning the address of the defective row or column to the redundant row or column 91 such that, when an address corresponding to the defective row or column is received, the redundant row or column 91 is addressed instead.

To make substitution of the redundant row or column 91 substantially transparent to a system employing the memory device 90, the memory device 90 includes an address detection circuit (not illustrated). The address detection circuit monitors the row and column addresses and, when the address of a defective row or column is received, enables the redundant row or column 91 instead.

One type of address detection circuit is a fuse-bank address detection circuit. An example of such a circuit and the application of this type of circuit to a memory integrated circuit is given in U.S. Pat. No. 5,583,463, issued on Dec. 10, 1996 to T. Merritt, which is incorporated herein by reference. Fuse-bank address detection circuits employ a bank of sense lines where each sense line corresponds to a bit of an address.

The sense lines are programmed by blowing fuses such as fuse 96 of FIG. 6 in the sense lines in a pattern corresponding to the address of the defective row or column. Addresses are then detected by first applying a test voltage across the bank of sense lines. Then, bits of the address are applied to the sense lines. When the pattern of blown fuses 96 corresponds exactly to the pattern of address bits, the sense lines all block current and the voltage across the bank remains high. Otherwise, at least one sense line conducts and the voltage falls. A high voltage thus indicates that the programmed address has been detected and the redundant row or column 91 is addressed in the auxiliary array 94. A low voltage indicates that a different address has been applied and a corresponding memory element in the memory array 93 is addressed.

Figure 7:
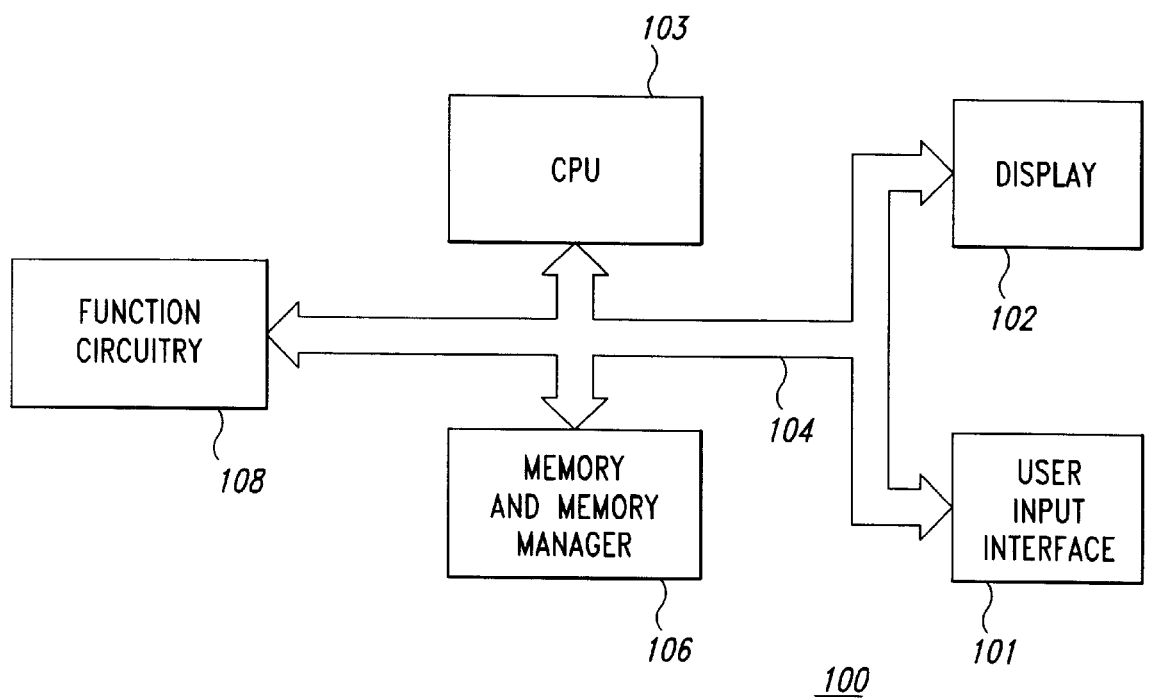
FIG. 7 is a simplified block diagram of a computer using an integrated circuit manufactured according to an embodiment of the present invention.

FIG. 7 is a simplified block diagram of a computer 100 using an integrated circuit such as the memory device 90 of FIG. 6. The computer 100 includes a central processing unit 103 coupled via a bus 104 to a memory and memory manager 106, function circuitry 108, user input interface 101 and a display 102. The central processing unit 103 carries out instructions obtained from the memory via the memory manager 106 in response to input from the user input interface 101 and displays results on the display 102. The central processing unit 103 also stores results in the memory via the memory manager 106.

The memory of the memory and memory manager 106 is an example where embodiments of the instant invention such as the memory device 90 of FIG. 6 are useful. While the present invention is particularly useful in large memory arrays (i.e., RAM memories, particularly those having 16 megabytes or more of memory) for use in personal computers and workstations, examples of other systems where such computers 100 including a memory according to embodiments of the present invention find application include camcorders, televisions, automobile electronic systems, microwave ovens and other home and industrial appliances.

Although the present invention has been described with reference to several embodiments, the invention is not limited to these embodiments. Rather, the invention is limited only by the appended claims, which include within their scope all equivalent devices or methods which operate according to the principles of the invention as described.

What is claimed is:

1. An apparatus comprising:

a substrate;

a fuse comprising conductive material supported by the substrate;

a series of dielectric layers overlying the substrate and the fuse;

an opening formed above the fuse and extending through the series of dielectric layers at least to the fuse; and a dielectric layer formed on the fuse, the dielectric layer being fabricated separately from the fabrication of the series of dielectric layers, at least one of the series of the dielectric layers having a portion exposed by the opening remaining exposed through the dielectric layer.

2. The apparatus of claim 1, further comprising a dynamic random access memory circuit formed on the substrate.

3. The apparatus of claim 1, further comprising a dynamic random access memory circuit including at least 16 megabytes of memory formed on the substrate.

4. The apparatus of claim 1 wherein the fuse comprises polysilicon.

5. The apparatus of claim 1 wherein the fuse comprises:

a layer of polysilicon having a thickness of a 1,000 angstroms disposed on an oxide formed on the substrate; and a layer of tungsten silicide having a thickness of 1,200 angstroms formed on the layer of polysilicon.

6. The apparatus of claim 1 wherein the series of dielectric layers comprises:

a first dielectric layer formed on the fuse and the substrate;

a second dielectric layer formed on the first dielectric layer;

a third dielectric layer formed on the second dielectric layer; and a fourth dielectric layer formed on the third dielectric layer, wherein the series of dielectric layers provide greater than four microns of composite thickness.

7. The apparatus of claim 6 wherein the dielectric layer formed on the fuse has a thickness of between 2,000 and 3,000 angstroms.

8. The apparatus of claim 6 wherein the dielectric layer formed on the fuse comprises a layer of silicon dioxide.

9. The apparatus of claim 1 wherein the series of dielectric layers comprises:

a first dielectric layer formed on the fuse and the substrate;

a second dielectric layer formed on the first dielectric layer;

a third dielectric layer formed on the second dielectric layer;

a fourth dielectric layer formed on the third dielectric layer;

a fifth dielectric layer formed on the fourth dielectric layer;

a sixth dielectric layer formed on the fifth dielectric layer; and a passivation layer formed on the sixth dielectric layer, wherein the series of dielectric layers provide greater than seven microns of composite thickness.

10. The apparatus of claim 9 wherein the dielectric layer formed on the fuse has a thickness of between 2,000 and 3,000 angstroms.

11. The apparatus of claim 10 wherein the dielectric layer formed on the fuse comprises a material chosen from a group consisting of silicon dioxide and silicon nitride.

12. The apparatus of claim 1 wherein the series of dielectric layers comprise a series of dielectric layers providing greater than four microns of composite thickness.

13. The apparatus of claim 1 wherein the substrate comprises a silicon substrate.

14. A random access memory comprising:

a substrate;

random access memory circuitry formed on the substrate;

a series of fuses comprising conductive material supported by the substrate;

a series of dielectric layers formed on the substrate and the series of fuses;

an opening formed above at least one of the series of fuses and extending through the series of dielectric layers at least to the series of fuses; and a dielectric layer formed on the series of fuses, the dielectric layer being fabricated separately from the series of dielectric layers, at least one of the series of the dielectric layers having a portion exposed by the opening remaining exposed through the dielectric layer.

15. The random access memory of claim 14 wherein the series of fuses permit redundant memory array elements to replace defective memory array elements in the random access memory array.

16. The random access memory of claim 14 wherein each of the series of fuses comprise a layer of polysilicon formed on the substrate.

17. The random access memory of claim 16 wherein each of the series of fuses further comprise a layer of tungsten silicide formed on the layer of polysilicon, the layer of polysilicon and the layer of tungsten silicide comprising a total thickness of between 1,800 and 2,600 angstroms.

18. The random access memory of claim 14 wherein:

the series of dielectric layers comprises a series of silicon dioxide layers having greater than four microns of composite thickness; and the dielectric layer formed on the series of fuses has a thickness of between 2,000 and 3,000 angstroms and comprises a material chosen from a group consisting of silicon dioxide and silicon nitride.

19. A computer including:

a central processing unit coupled to a bus;

an input/output interface coupled to the bus;

a read-only memory coupled to the central processing unit; and a random access memory coupled to the central processing unit, wherein the random access memory comprises:

a substrate;

a random access memory array formed on the substrate;

a series of fuses comprising conductive material supported by the substrate;

a series of dielectric layers formed on the series of fuses and the substrate;

a series of openings each formed above at least one of the series of fuses and extending through the series of dielectric layers to the series of fuses; and a dielectric layer formed on the series of fuses, the dielectric layer being formed separately from the series of dielectric layers, at least one of the series of the dielectric layers having a portion exposed by the opening remaining exposed through the dielectric layer.

20. The computer of claim 19 wherein the series of fuses each comprise:

a layer of polysilicon formed on the substrate; and a layer of tungsten silicide formed on the layer of polysilicon, the layer of polysilicon and the layer of tungsten silicide comprising a total thickness of between 1,800 and 2,600 angstroms.

21. The computer of claim 19 wherein:

the series of dielectric layers comprises a series of silicon dioxide layers having greater than four microns of composite thickness; and the dielectric layer formed on the series of fuses has a thickness of between 2,000 and 3,000 angstroms and comprises a material chosen from a group consisting of silicon dioxide and silicon nitride.

22. The computer of claim 19 wherein the series of fuses permit redundant memory array elements to replace defective memory array elements in the random access memory array.

\* \* \* \* \*